(12) United States Patent
Hellwig (10) Patent No.: US 7,462,246 B2
(45) Date of Patent: Dec. 9, 2008

(54) MODIFIED SUSCEPTOR FOR BARREL REACTOR

(75) Inventor: Lance G. Hellwig, Florissant, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 370 days.

(21) Appl. No.: 11/107,444

(22) Filed: Apr. 15, 2005

(65) Prior Publication Data

US 2006/0231035 A1 Oct. 19, 2006

(51) Int. Cl.
*C23C 16/00* (2006.01)

(52) U.S. Cl. .................. 118/728; 118/715; 156/917

(58) Field of Classification Search .............. 156/917; 118/728

See application file for complete search history.

(56) References Cited

U.S. PATENT DOCUMENTS

| | | | | |
|---|---|---|---|---|
| 4,612,207 | A | * | 9/1986 | Jansen ................. 427/576 |
| 4,823,736 | A | * | 4/1989 | Post et al. ............. 118/730 |
| 4,990,374 | A | | 2/1991 | Keeley et al. |
| 5,033,538 | A | | 7/1991 | Wagner et al. |
| 5,051,054 | A | | 9/1991 | Wagner et al. |
| 5,177,878 | A | | 1/1993 | Visser |
| 5,180,000 | A | | 1/1993 | Wagner et al. |
| 5,769,942 | A | | 6/1998 | Maeda |
| 5,843,234 | A | | 12/1998 | Finn et al. |
| 5,904,769 | A | | 5/1999 | Ohashi et al. |
| 6,129,047 | A | | 10/2000 | Nakamura |
| 6,129,048 | A | | 10/2000 | Sullivan |
| 6,262,397 | B1 | | 7/2001 | Yazawa |
| 6,444,027 | B1 | | 9/2002 | Yang et al. |
| 6,596,095 | B2 | | 7/2003 | Ries et al. |
| 6,652,650 | B2 | | 11/2003 | Yang et al. |
| 2005/0000449 | A1 | | 1/2005 | Ishibashi et al. |

FOREIGN PATENT DOCUMENTS

| | | |
|---|---|---|
| JP | 63-58819 | 3/1988 |
| JP | 08-8198 | 1/1996 |
| JP | 10-223545 | 8/1998 |
| JP | 11-087250 | 3/1999 |
| WO | WO 90/13687 A2 | 11/1990 |
| WO | WO 03/060967 A1 | 7/2003 |

* cited by examiner

*Primary Examiner*—Michael Cleveland
*Assistant Examiner*—Keath T Chen
(74) *Attorney, Agent, or Firm*—Armstrong Teasdale LLP (57) ABSTRACT

A susceptor for supporting wafers during an chemical vapor deposition process. The susceptor has recesses and orifices disposed in the recesses extending to a central passage of the susceptor. The susceptor has exhaust openings disposed in the top of the susceptor to allow gas from the central passage of the susceptor to exit out the openings. A baffle plate covers the exhaust openings and a vertical space is created between the baffle plate and the top of the susceptor to allow gas to exit from the central passage to outside the susceptor. The bottom of the susceptor also has exhaust openings disposed therein. These openings allow gas from the central passage to exit the susceptor.

9 Claims, 12 Drawing Sheets

MODIFIED SUSCEPTOR FOR BARREL REACTOR

BACKGROUND OF THE INVENTION

The present invention relates generally to preparation of semiconductor wafers. More specifically, the present invention relates to a modified susceptor to decrease autodoping of semiconductor wafers when the wafers are being treated in a barrel-type reactor.

Chemical vapor deposition is a process for growing a thin layer of material on a semiconductor wafer so that the lattice structure is identical to that of the wafer. Using this process, a layer having different conductivity may be applied to the semiconductor wafer to achieve the necessary electrical properties. Chemical vapor deposition is widely used in semiconductor wafer production to build up epitaxial layers such that devices can be fabricated directly on the epitaxial layer. For example, a lightly doped epitaxial layer deposited over a heavily doped substrate permits a CMOS device to be optimized for latch up immunity as a result of the low resistance of the substrate. Other advantages, such as precise control of the dopant concentration profile and freedom from oxygen are also achieved. Conventional epitaxial deposition processes are disclosed in U.S. Pat. Nos. 5,904,769 and 5,769,942, which are herein incorporated by reference.

Figure 1:
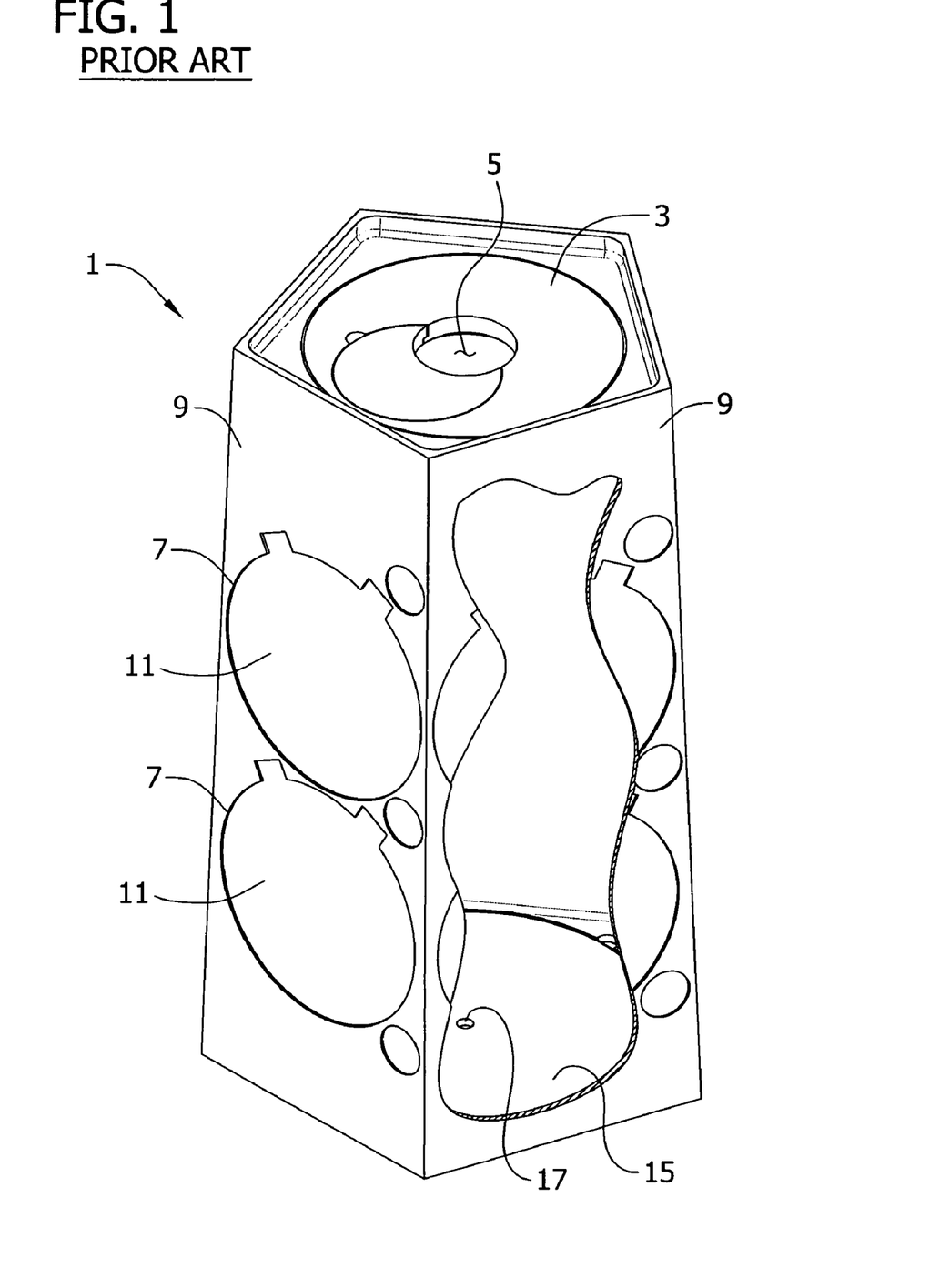
FIG. 1 is a perspective of a conventional barrel susceptor partially broken away to show internal construction.

The epitaxial deposition process takes place in a reactor. There are various types of reactors including horizontal reactors, vertical reactors (also called pancake reactors) and barrel reactors. The barrel reactor (also referred to as a batch reactor) is advantageous because it simultaneously processes a number of wafers, typically between 10 and 15 wafers, in a single run. In a barrel reactor, a barrel susceptor is used to support the wafers during the epitaxial deposition process. The silicon wafers are loaded onto the barrel susceptor, and then the susceptor is loaded into a reaction chamber of the reactor. FIG. 1 illustrates a typical conventional barrel susceptor. The barrel susceptor has generally laterally facing, sloping faces, and each face has a pair of circular recesses aligned in a generally vertical column for receiving a single wafer. Each recess of the susceptor has a solid, non-porous rear surface on which a backside of the wafer rests. Preferably, the body of the susceptor is constructed of silicon carbide coated graphite to reduce the amount of contaminants such as iron released from the graphite into the surrounding ambient during high temperature processes, although other material used in manufacture of the body is contemplated and within the scope of this invention. Conventional barrel susceptors are well known in the art and described in U.S. Pat. No. 6,129,048.

The epitaxial deposition process typically involves two steps. First, after the wafers have been loaded onto the barrel susceptor and the susceptor is received in the reaction chamber, the front surfaces of the wafers are subjected to a cleaning gas such as hydrogen or a hydrogen/hydrochloric acid mixture at about 1150° C. to "pre-bake" and clean the front surfaces of the silicon wafers and remove any native oxide on the surfaces to allow the epitaxial silicon layers to grow continuously and evenly onto the front surfaces. In the second step of the epitaxial deposition process, the front surfaces of the wafers are subjected to a Si source reactant gas. For example, a vaporous silicon source such as silane or trichlorosilane may be introduced at about 800° C. or higher to deposit and grow epitaxial layers of silicon on the front surfaces of the wafers. During both steps, the susceptor is rotating within the reaction chamber.

A problem encountered during the high temperature pre-bake and high temperature growth of the epitaxial silicon layer is the out-diffusion of dopant atoms such as boron or phosphorus through the back surface of the silicon wafer. With conventional barrel susceptors, the dopant atoms that out-diffuse from the back surface can effuse from between the wafer edge and the susceptor toward the front surface of the wafer. These dopant atoms can be incorporated into and contaminate the growing deposition layer and degrade the resistivity uniformity near the wafer edge. Silicon wafers having etched or polished back surfaces are subject to out-diffusion of dopant atoms from the back surface during the epitaxial deposition process which can lead to unwanted autodoping of the front surface.

Several methods have been suggested for attempting to eliminate autodoping. Hoshi (Japanese Unexamined Patent Application No. JP11-87250) discloses using vacuum sucking on the edge of a susceptor to evacuate boron dopant on the edge of the susceptor and prevent autodoping. This process may affect wafer edge uniformity and thickness and requires substantial modification to existing epitaxial deposition systems. Nakamura (Japanese Unexamined Patent Application JP10-223545) discloses a modified susceptor having slots on the edge of the susceptor such that the out-diffused dopant atoms would be pushed down through the slots and into the exhaust. This method also allows a substantial amount of the deposition gas to be evacuated below the back surface of the wafer which can lead to premature corrosion of the exhaust system and safety concerns.

SUMMARY OF THE INVENTION

In general, the present invention relates to a susceptor for supporting wafers in a reaction chamber of a barrel reactor during a chemical vapor deposition process. The susceptor includes a body having a top, a bottom, a generally elongate central passage within the body extending between the top and bottom of the body, and a plurality of wafer supporting faces directed generally laterally away from the central passage. The susceptor also includes a plurality of recesses in each of the wafer supporting faces of the body having a rear surface. Each recess is sized and shaped to receive and support the wafer so that when the wafer is received in one of the recesses a front surface of the wafer faces generally away from the rear surface and a rear surface of the wafer is in a generally opposed relationship with the rear surface of the recess. The front surface of the wafer is exposed to reactant gas inside the reaction chamber of the barrel reactor. A plurality of orifices are disposed in the rear surface of each recess. The orifices extend to the central passage of the body such that each recess is in fluid communication with the central passage.

In another aspect, a susceptor for supporting wafers in a reaction chamber of a barrel reactor during a chemical deposition process generally includes a body having a top, a bottom, a generally elongate central passage within the body extending between the top and the bottom of the body, and a face directed laterally generally away from the central passage. A plurality of recesses having a rear surface are in the face of the body. Each recess is sized and shaped to receive and support a wafer so that when the wafer is received within the recess, a front surface of the wafer faces generally away from the rear surface of the recess and a rear surface of the wafer is in a generally opposed relationship with the rear surface of the recess. The front surface of the wafer is exposed to reactant gas inside the reaction chamber of the barrel reactor. At least one orifice is in the rear surface of each recess. The orifice extends to the central passage of the body such that each recess is in fluid communication with the central passage. An exhaust opening is in the top of the body in communication with the central passage. The exhaust opening is adapted to exhaust gas from the central passage to outside the susceptor when the susceptor is secured to a hanger to lessen the gas pressure being exerted on the rear surface of the wafer when the wafer is received in the circular recess caused by expanding gas in the central passage passing through the orifice and into the recess.

In yet another aspect, a susceptor for supporting wafers in a reaction chamber of a barrel reactor during a chemical deposition process generally includes a body having a top, a bottom, a generally elongate central passage within the body extending between the top and the bottom of the body, and a face directed laterally generally away from the central passage. Plural recesses having a rear surface are in the face of the body. Each recess is sized and shaped to receive and support a wafer so that when the wafer is received within the recess, a front surface of the wafer faces generally away from the rear surface of the recess and a rear surface of the wafer is in a generally opposed relationship with the rear surface of the recess. The front surface of the wafer is exposed to reactant gas inside the reaction chamber of the barrel reactor. At least one orifice is in the rear surface of each recess. The orifice extends to the central passage of the body such that each recess is in fluid communication with the central passage. The orifice is angled in a direction such that the orifice intersects the rear surface of the recess at a location below where it intersects the central passage.

BRIEF DESCRIPTION OF THE DRAWINGS

Corresponding reference characters indicate corresponding parts throughout the drawings.

DETAILED DESCRIPTION OF THE DRAWINGS

Referring now to the drawings and in particular to FIG. 1, a conventional barrel susceptor for use in supporting semiconductor wafers during epitaxial deposition in a barrel reactor is generally indicated at 1. The susceptor 1 has an assembled top 3 that is solid except for a large central opening 5 for receiving a hanger on which the susceptor is hung during epitaxial deposition. The susceptor 1 has a pair of circular recesses 7 for supporting semiconductor wafers disposed in each of its five faces 9. The recesses 7 have solid rear walls 11 which contact the wafers when the wafers are in the recesses. The susceptor 1 also has a bottom 15 that is generally solid except for a central opening 17 that exhausts purge gas, as described in more detail below.

Figure 3:
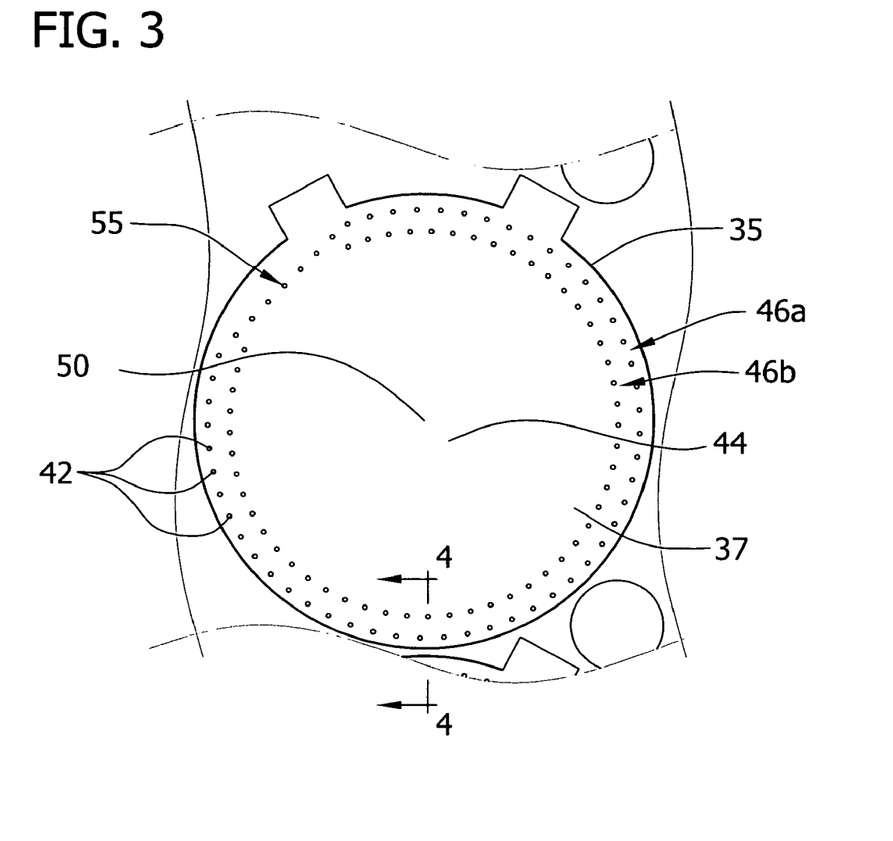
FIG. 3 is an enlarged fragmentary view of the susceptor of FIG. 2 showing one recess.
Figure 4:
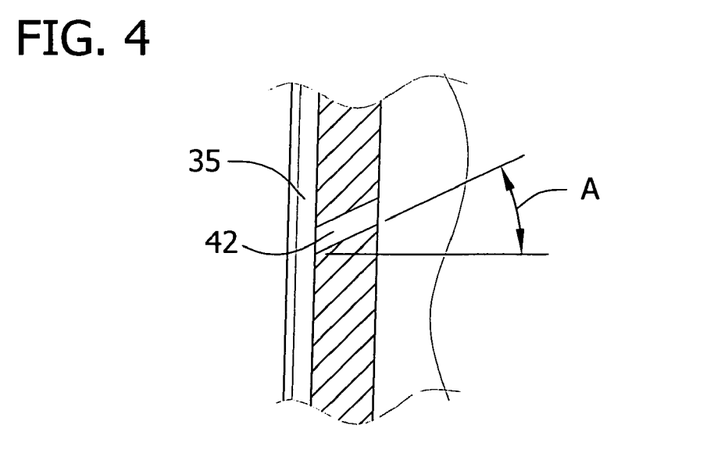
FIG. 4 is a fragmentary section taken in the plane including line 4-4 of FIG. 3 and showing a vertical section of one orifice.
Figure 5:
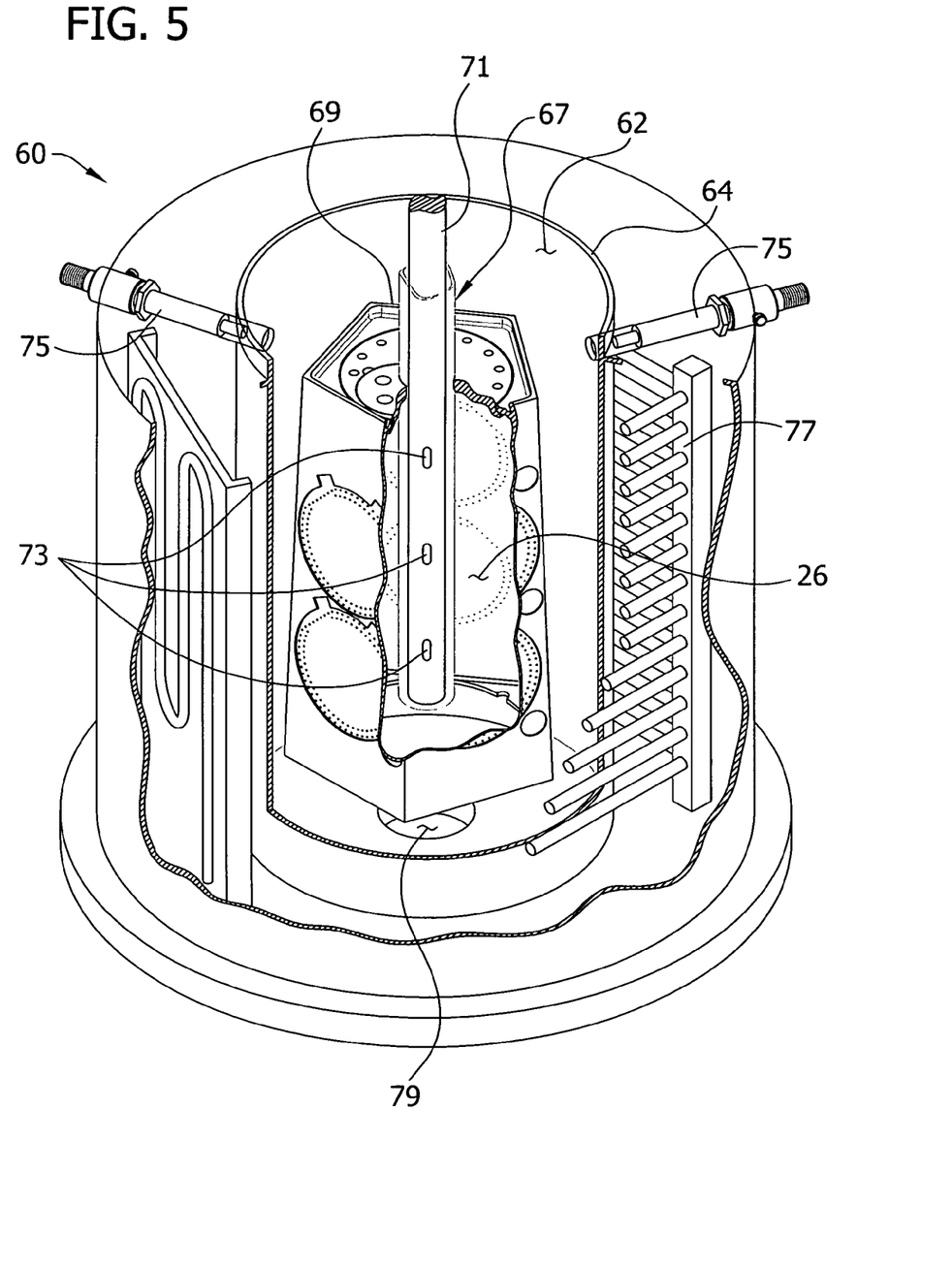
FIG. 5 is a schematic perspective of a barrel reactor with parts broken away to show details.

Referring to FIGS. 2-6, a modified barrel susceptor constructed according to the principles of the present invention is generally indicated at 20. The susceptor 20 has a generally prismatic body 20A that is sized and shaped for receipt within a barrel reactor (FIG. 5 schematically illustrates a barrel reactor, generally indicated at 60). The body 20A of the susceptor has a top, generally indicated at 22, a bottom 24, a generally elongate central passage 26 within the body extending between the top and bottom of the body, and five generally laterally facing, sloping faces 28. The top 22 of the body 20A includes components that are assembled to form a central opening 31 for receiving a hanger on which the susceptor 20 is hung within a barrel reactor (described hereinafter) during the epitaxial deposition process. Each face 28 of the susceptor 20 has a pair of circular recesses 35 aligned in a generally vertical column. When a wafer W (FIG. 6) is received in the recess 35, a front surface 36 of the wafer faces generally away from a rear surface 37 of the recess, thereby exposing the front surface of the wafer to the reactant gas inside a bell jar of the barrel reactor. The present invention is structurally similar to the conventional susceptor 1 of FIG. 1, except that the top 22 of the susceptor has a plurality of exhaust openings 40 and the rear surface 37 of each recess 35 has a plurality of orifices 42. Each exhaust opening 40 extends to the central passage 26 of the susceptor 20, and as can be best seen in FIG. 4, each orifice 42 extends from the rear surface 37 of the recess 35 to the central passage of the susceptor. It is understood that the susceptor 20 of the present invention may differ structurally from the illustrated embodiment without departing from the scope of this invention. The recesses 35 may be any number of sizes suitable for supporting, for example, a 150 mm, 200 mm, or 300 mm semiconductor wafer or any other wafer size. The number of the faces 28 of the susceptor 20 may vary, and, each face of the susceptor may have any number of recesses 35 (e.g., three recesses). Other configurations of the susceptor 20 are within the scope of this invention.

As can be seen best in FIG. 3, in one embodiment the orifices 42 of the susceptor 20 are disposed generally adjacent the periphery of the rear surface 37 of the recess 35, and a center region 44 of the recess is substantially free of the orifices. The orifices 42 are preferably adjacent the periphery of the rear surface 37 of the recess 35 because out-diffused dopants from the backside 36b of the wafer W typically migrate toward the outer edge of the wafer, as described below. Other arrangements of the orifices 42 are contemplated and within the scope of this invention. For example, the orifices 42 may be generally uniformly distributed across each rear surface 37 of the recesses 35.

As best seen in FIG. 3, the orifices 42 are arranged in a first ring-shaped group, generally indicated at 46a, and second ring-shaped group, generally indicated at 46b, extending along arcs terminating just short of full rings, thus forming open ring configurations. The orifices 42 in each group are generally equidistantly spaced from a center 50 of the rear surface 37 of the recess 35. The first ring-shaped group 46a is situated the furthest from the center 50 of the recess 35. The recess 35 also has a third flatted group, generally indicated at 55, comprising orifices 42 extending along a straight line or chord between spaced ends of the first group 46a. The wafer W is arranged in the recess (FIG. 2) so that a flatted edge margin of the wafer lies generally over the flatted group 55 of orifices 42. Basically, the configuration of the first ring-shaped group 46a and the third flatted group 55 is such that the orifices 42 in the groups are generally coextensive with the periphery of the wafer W. This embodiment helps to ensure that the wafer W covers all of the orifices 42 thereby substantially precluding reactant gas from entering into the central passage 26 of the susceptor 20 via the orifices 42. For reasons explained in detail below, it is desirable to preclude reactant gas from entering the central passage 26 of the susceptor 20.

The orifices 42 of the illustrated embodiment have a circular cross-section preferably having an area between about 0.001 in$^2$ (0.645 mm$^2$) and 0.004 in$^2$ (2.580 mm$^2$). It is understood that the shapes of the cross-sections of the orifices 42 may be squares, slots, diamonds, or any other shapes allowing fluid flow therethrough. It is also understood that the area of the cross-section of the orifices 42 may be any size as long as they allow fluid flow therethrough. The sizes and shapes of the orifices 42 may depend on the location and the number of orifices in the recess 35.

Referring to FIG. 5, a barrel susceptor 20 of the illustrated embodiment is received in a conventional barrel reactor, generally indicated at 60. The reactor 60 comprises a reaction chamber 62 formed from an inverted quartz bell jar 64, a gas ring (not shown) mounted on the upper end of the bell jar, and a seal plate (not shown) for selectively covering the gas ring and bell jar to isolate a reaction chamber inside the reactor. The susceptor 20 is hung on a hanger, generally indicated at 67, extending from the seal plate and into the central passage 26 of the susceptor. The hanger 67 comprises a quartz sheath 69 and a radiometer 71 extending through the sheath. Three vertically aligned pyrometers 73 for detecting temperature are disposed along the length of the radiometer 71. Nozzles 75 for introducing reactant gas into the reaction chamber 62 are disposed adjacent the top of the reactor 60 and are in fluid communication with the reaction chamber 62. Quartz lamps 77 for heating the reaction chamber 62, susceptor 20 and wafers W surround the reaction chamber. This barrel reactor 60 is conventional and well-known in the art.

Figure 6:
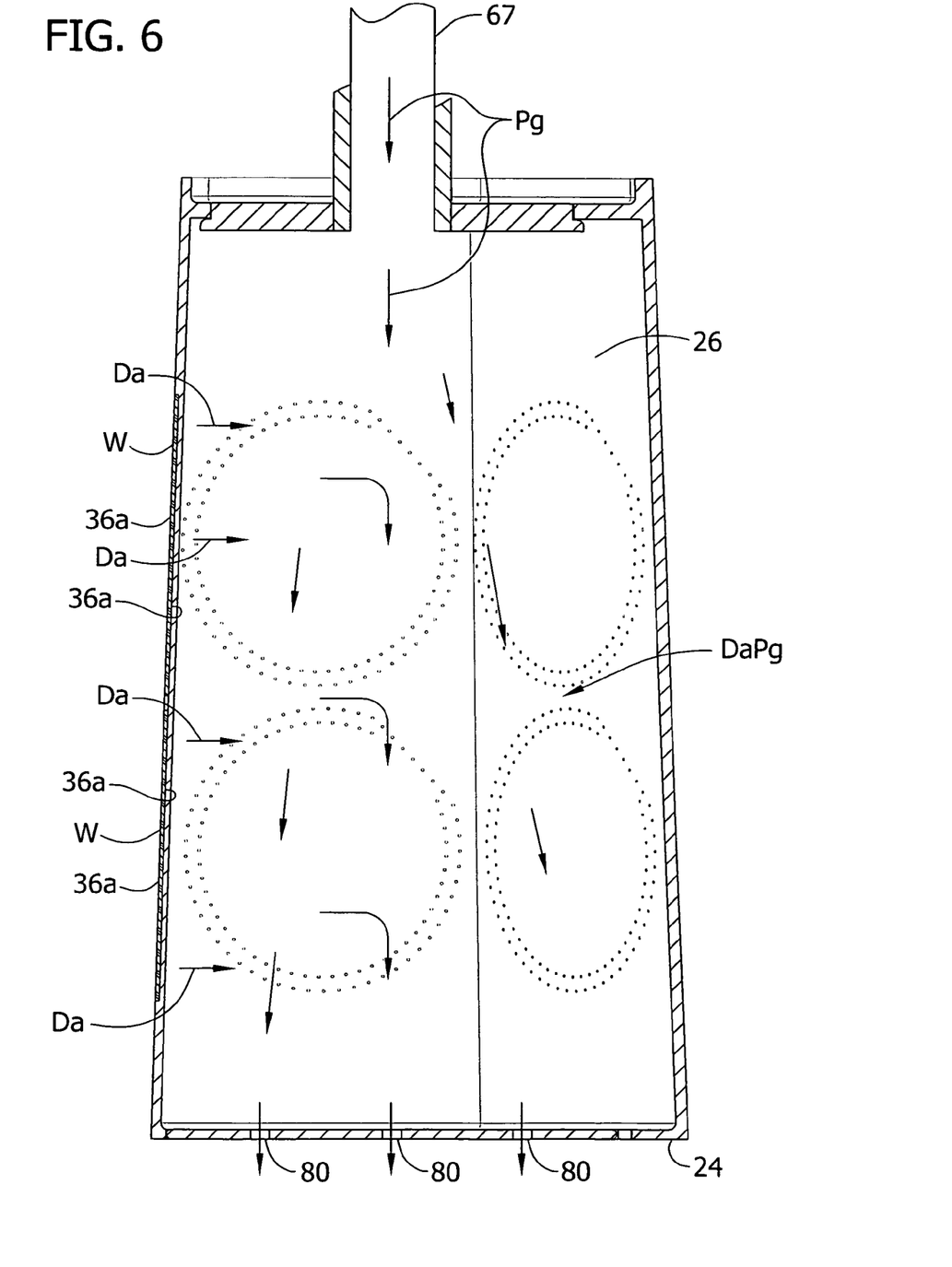
FIG. 6 is a vertical section of the modified susceptor illustrating flow of out-diffused dopants and purge gas in a central passage thereof.

During the epitaxial deposition process, the susceptor 20 is hung on the hanger 67 and semiconductor wafers W are loaded into the recesses 35. The susceptor 20 is then lowered into the reaction chamber 62. Once the top of the reactor 60 is sealed and the system is purged with nitrogen gas, hydrogen gas is continuously injected into the reaction chamber 62 through the nozzles 75 followed by a Si source reactant gas (e.g., SiCl$_4$, SiHCl$_3$, SiH$_2$Cl$_2$, or SiH$_4$). The quartz lamps 77 heat the reactant gas, the susceptor 20 and the wafers W in the reaction chamber 62 and the epitaxial deposition takes place on the front faces of the wafers W. Reactant gas is exhausted through a vent 79 at the bottom of reaction chamber 62. The pyrometers 73 on the radiometer 71 detect the temperature of the susceptor 20 during epitaxial process to ensure that the process takes place at an optimal temperature. As shown in FIG. 6, hydrogen purge gas is continuously introduced into the central passage 26 of the susceptor 20 via the hanger 67 to preclude any reactant gas that may enter into the central passage from coating the quartz hanger and obstructing the pyrometers 73. The flow of purge gas from the hanger is indicated by reference character P$_g$. This purge gas is exhausted out of the central passage 26 through one or more exhaust openings 80 in the bottom 24 of the susceptor 20. The bottom 24 of the susceptor 20 has a plurality of exhaust openings 80, for reasons discussed below. After the process is complete, a lift assembly raises the seal plate, hanger 67, and susceptor 20 to open the chamber 62 and withdraw the susceptor from the chamber so the wafers W may be unloaded. This process is conventional and well known in the art.

The orifices 42 in each recess 35 of the modified susceptor 20 decrease or substantially eliminate autodoping of the associated semiconductor wafer W during epitaxial deposition in a barrel reactor 60. Autodoping is the introduction of unintentional dopants released from the wafers W into the epitaxial layer forming on the wafers. During epitaxial deposition, dopant atoms (e.g., boron and phosphorous atoms) are released from the wafer W through solid state diffusion or evaporation. These dopant atoms can be incorporated into and contaminate the growing deposition layer and degrade the resistivity uniformity of the wafer W, especially near the wafer's front edge. For example, with a conventional barrel susceptor (e.g., the barrel susceptor 1 of FIG. 1), dopants are released from the backside 36b of the wafer W through sold state diffusion and are incorporated into the front 36a of the wafer, especially the front side edge. The dopant atoms typically diffuse across the backside 36b of the wafer W because the rear wall 11 of the recess 7 is solid and non-permeable (see FIG. 1), the atoms travel laterally toward the edge of the wafer. The dopant atoms then may travel around the backside edge of the wafer W to the front side edge of the wafer where they contact the reactant gas and become part of the growing epitaxial layer at the front side edge.

As shown by FIG. 6, autodoping is decreased using the present invention because out-diffused dopant atoms from the backside 36b of a wafer W diffuse through the orifices 42 and into the central passage 26 of the susceptor 20 instead of being reincorporated into the front 36a of the wafer. The flow of dopants into the central passage 26 is indicated by reference character D$_a$. Once inside the central passage 26 of the susceptor 20, the dopants become entrained with the purge gas that is being continuously introduced from the hanger 67 and are exhausted out the exhaust openings 80 in the susceptor. The flow of entrained dopants and purge gas is generally indicated by reference character D$_a$P$_g$. As in the illustrated embodiment, the orifices 42 are preferably around the periphery of the recess 35 because, as described above, typically all out-diffused atoms from the backside 36b of the wafer W migrate toward the backside edge of the wafer and are incorporated into the front 36a of the wafer. By disposing the orifices 42 along the periphery of the recess 35, and thus about the periphery of the wafer W, it is likely that a majority of the dopant atoms released from the backside 36b of the wafer will flow into the orifices 42 during migration toward the edge of the wafer.

Referring back to FIG. 4, each orifice 42 of the recesses 35 is preferably angled in a direction such that the orifice intersects the rear surface 37 of the recess at a location below where it intersects the central passage 26. Preferably, an angle A of the orifice is between about 15 and 40 degrees, and more preferably about 25 degrees from horizontal. Other angles are possible. As described above in reference to FIG. 5, the barrel reactor 60 has quartz lamps 77 that surround the reaction chamber 62. The lamps 77 heat up the wafers W as well as the susceptor 20 causing the susceptor to glow. The pyrometers 73 inside the susceptor 20 detect the amount of glow of the susceptor, thereby determining temperature. Because the present invention has orifices 42 in the recesses 35 of the susceptor 20, light from the quartz lamps 77 may directly enter the central passage 26 of the susceptor via the orifices. Light contacting the pyrometers 73 would significantly interfere with the pyrometers' temperature readings. By angling the orifices 42, however, it is less likely that light from the quartz lamps 77 will directly enter the central passage 26. The angle A of the orifices 42 is also beneficial for helping to preclude expanding gas in the central passage 26 from flowing into the orifices 42 and out the recesses 35, as explained below.

Figure 2:
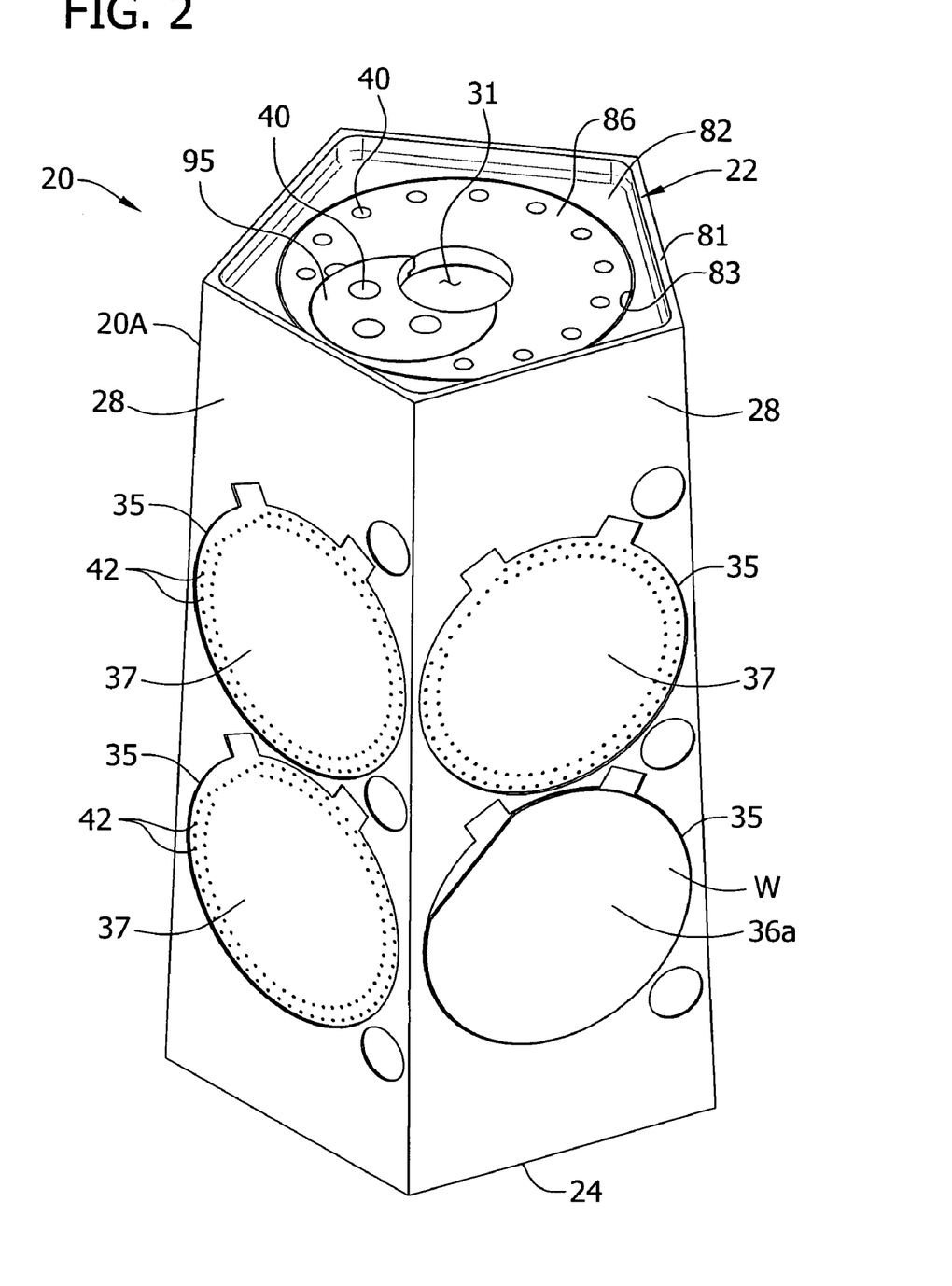
FIG. 2 is a perspective of one embodiment of a modified barrel susceptor of the present invention.
Figure 7:
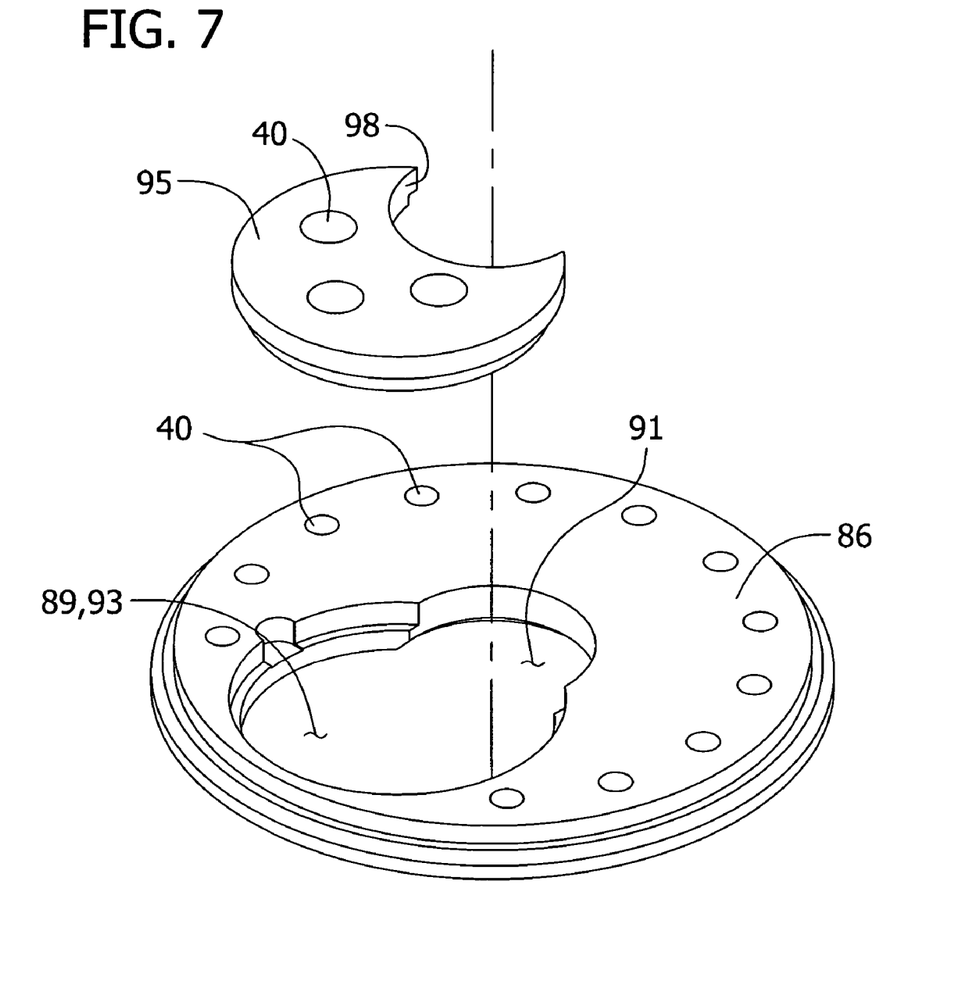
FIG. 7 is an exploded perspective of components of a top of the susceptor.
Figure 8:
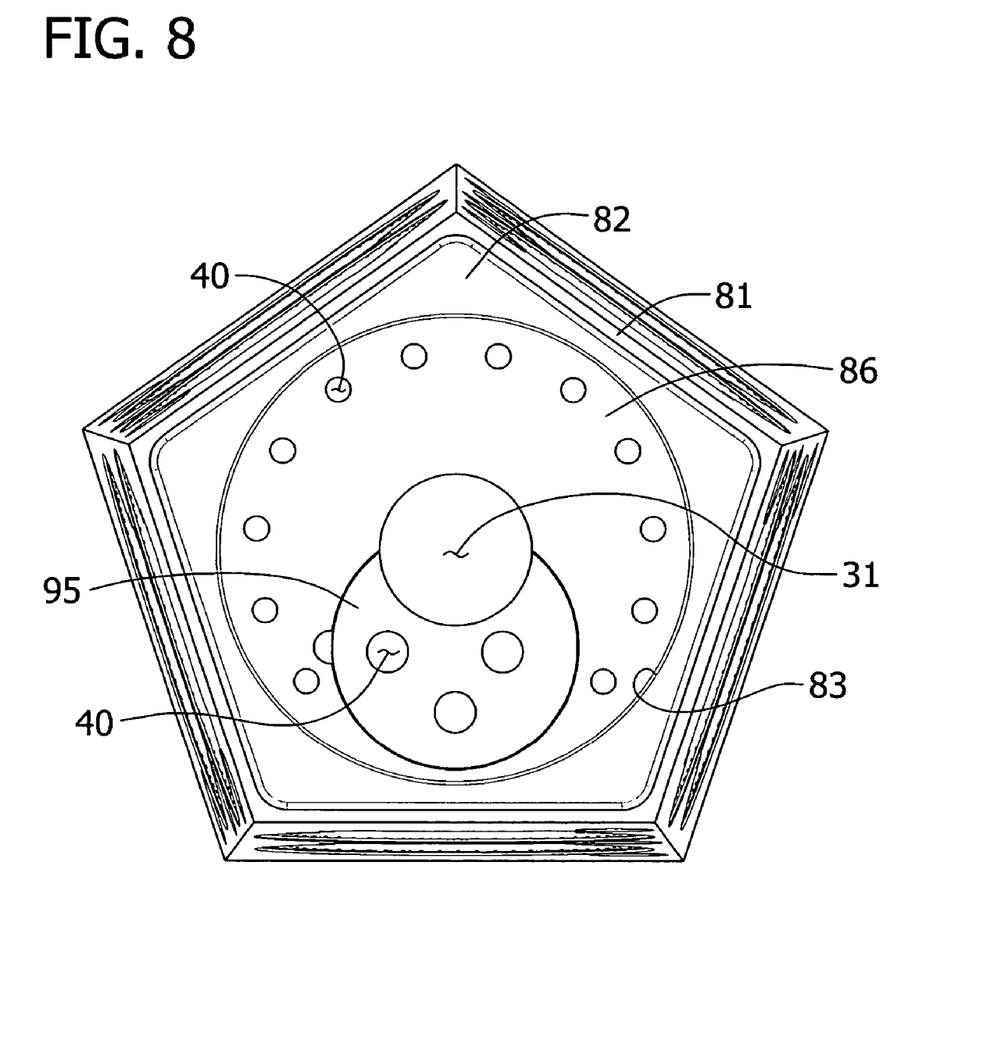
FIG. 8 is a top plan view of the susceptor.
Figure 9:
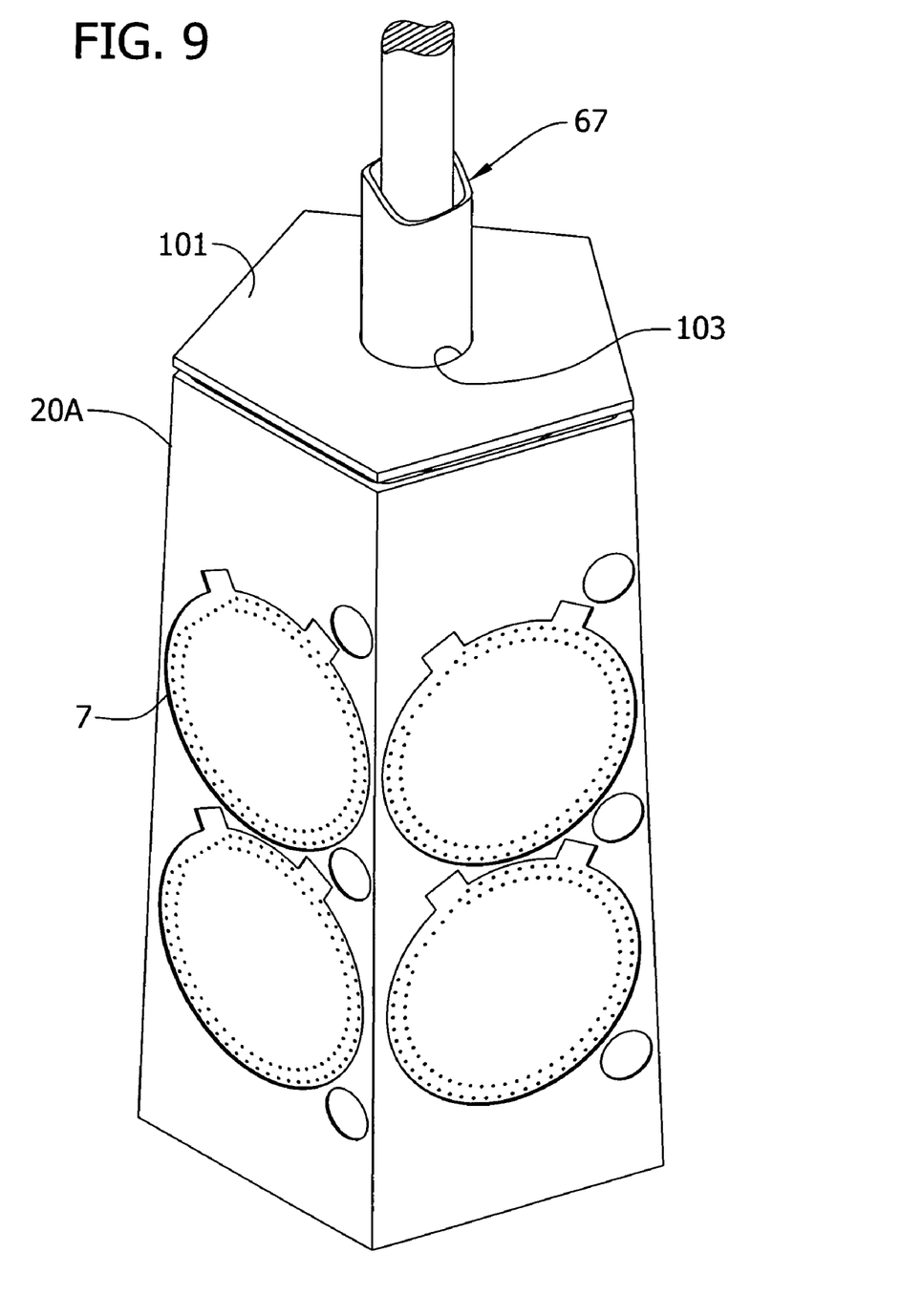
FIG. 9 is a perspective of the susceptor including a baffle plate mounted on the top of the susceptor.
Figure 10:
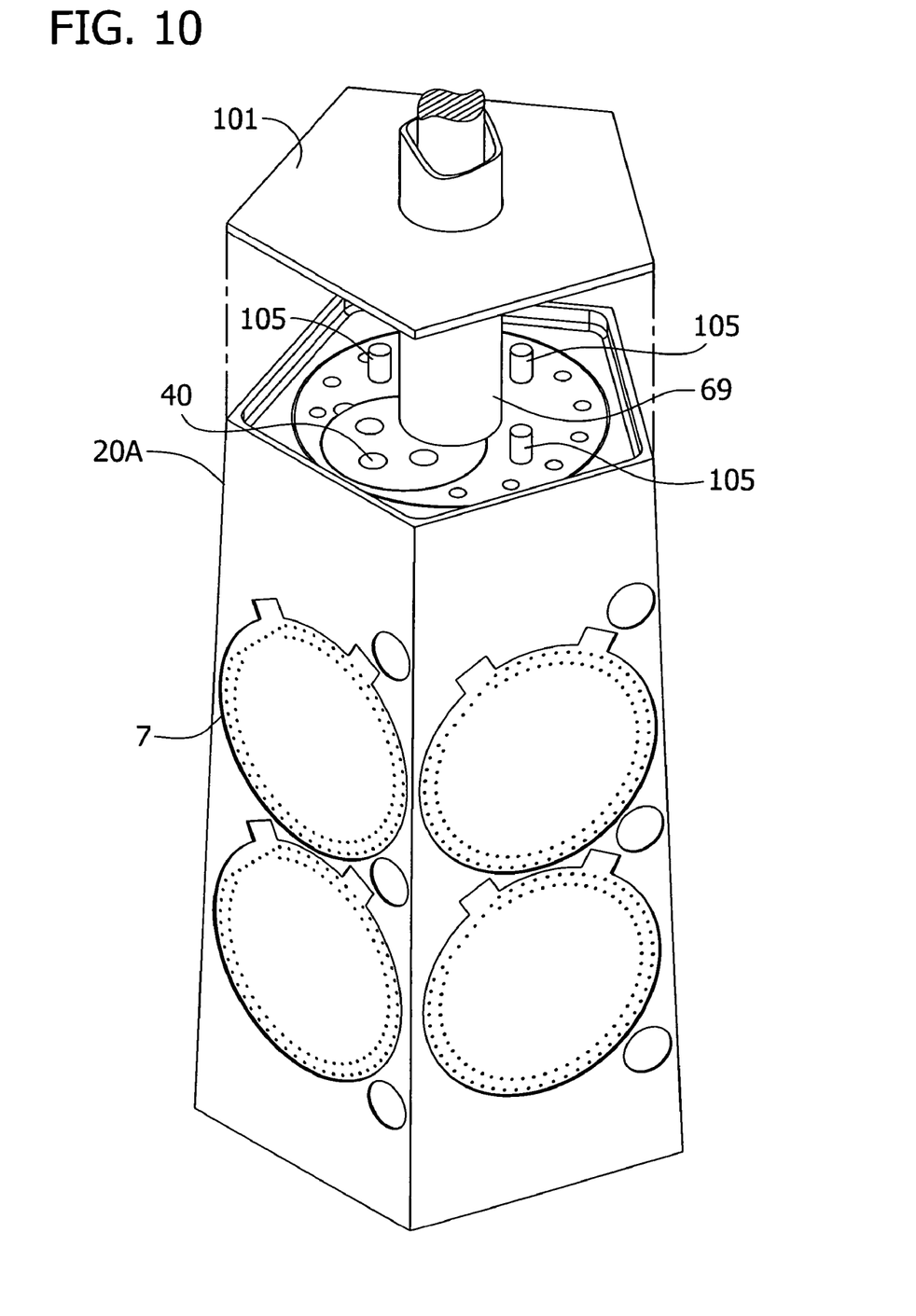
FIG. 10 is an exploded perspective of the modified susceptor of FIG. 9.
Figure 11:
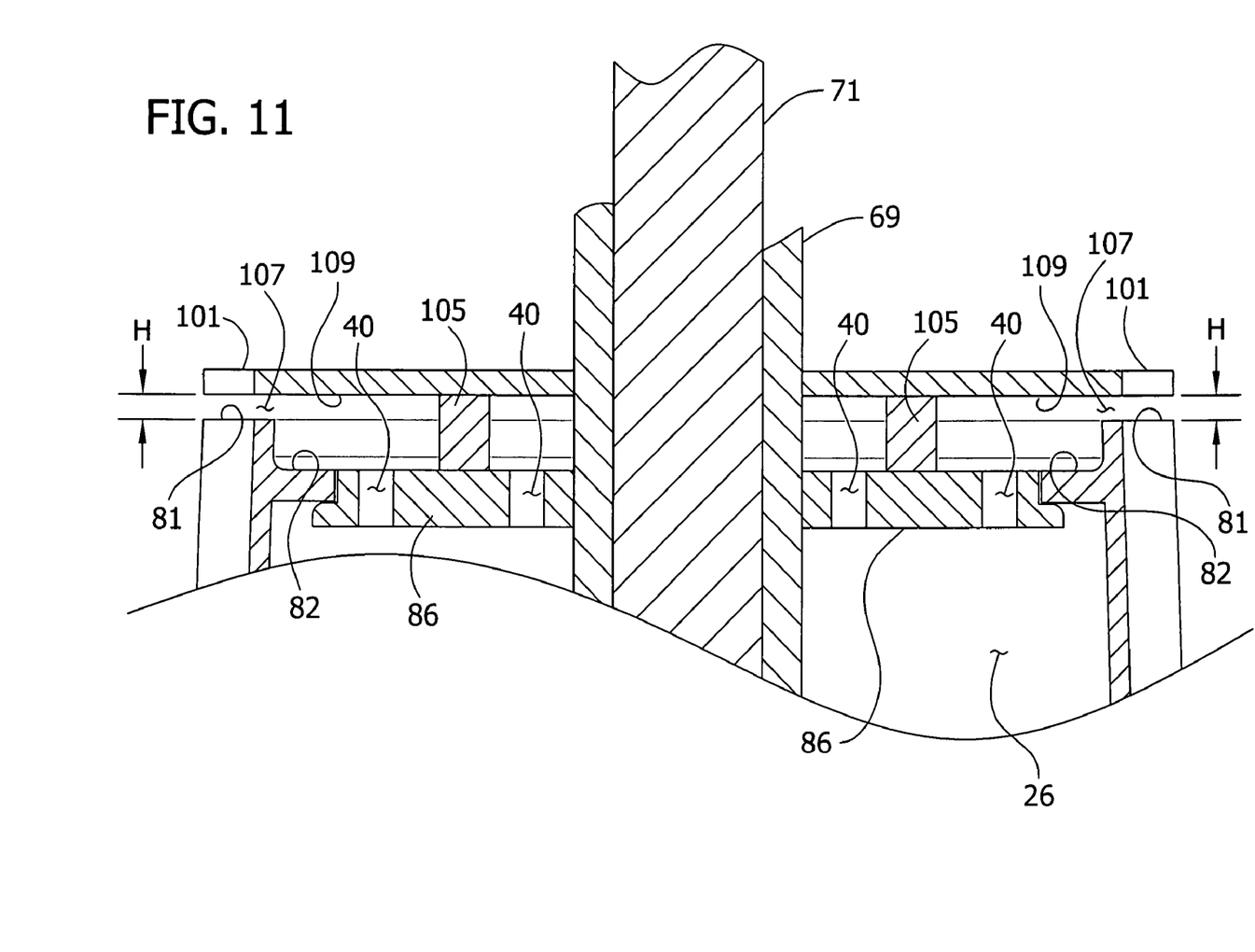
FIG. 11 is a fragmentary vertical section of the susceptor of FIG. 9 showing the top of the susceptor.

Referring to FIGS. 2 and 7-8, components of the top 22 of the modified susceptor 20 of the present embodiment are illustrated. As can be seen in FIG. 2, the top 22 of the susceptor 20 comprises a ledge 81 located at a periphery of the top of the body 20A. The ledge 81 surrounds a portion 82 of the top 22 of the susceptor 20 that is recessed from the ledge. A primary opening 83 is formed in the recessed portion 82 of the top 22 of the susceptor 20 and is sized and shaped for receiving a top plate 86. The top plate 86 has an opening 89 having a first semicircular section 91 intersecting a second larger circular section 93 such that the opening has a roughly keyhole shape. The circular section 93 of the top plate 86 is sized and shaped for receiving an exhaust plate 95 and supporting the exhaust plate. The exhaust plate 95 is generally circular but has a semicircular cutout 98 in a portion of the plate. When assembled the semicircular cutout 98 of the exhaust plate 95 and the semicircular section 91 of the opening 89 of the top plate 86 form the circular central opening 31 for receiving the hanger 67 of the barrel reactor 60 into the central passage 26 of the susceptor 20. As shown in FIG. 2, when assembled the top plate 86 and the exhaust plate 95 are generally coplanar with the recessed portion 82 of the top 22 of the susceptor 20. The above construction of the top 22 of the susceptor 20 is conventional and well-known in the art. It is understood that the top 22 of the susceptor 20 may be constructed in other ways. For example, the top 22 of the susceptor 20 instead may be one-piece component integrally formed with or separate from the susceptor 20. Alternatively, the top 22 may have any number of components without departing from the scope of this invention.

The exhaust plate 95 and the top plate 86 define the exhaust openings 40 that allow gas from inside the central passage 26 of the susceptor 20 to exhaust to outside the susceptor. In the illustrated embodiment, there are 3 exhaust openings 40 in the exhaust plate 95 that are substantially equidistantly spaced apart and are generally adjacent the center of the plate. The exhaust openings 40 in the exhaust plate 95 are circular and preferably have a cross-sectional area of between about 0.31 in$^2$ (200 mm$^2$) and 1.55 in$^2$ (1000 mm$^2$). Preferably, the exhaust plate 95 has between 1 and 8 exhaust openings, and more preferably between about 3 and 5 openings. The top plate 86 has 12 exhaust openings 40 that are circumferentially equidistantly spaced apart and generally adjacent the periphery of the top plate. These exhaust openings 40 are circular and preferably have a cross-sectional area of between about 1.0 in$^2$ (645.0 mm$^2$) and 2.0 in$^2$ (1290.0 mm$^2$). Preferably, the top plate 86 has between 1 and 15 exhaust openings 40, and more preferably between about 3 and 12 openings. For reasons discussed below, the sum of the cross-sectional areas of the exhaust openings 40 is preferably greater than the sum of the cross-sectional areas of the orifices 42 in the recesses 35. Although the illustrated embodiment has exhaust openings 40 in both the exhaust plate 95 and the top plate 86, it is understood that one or more exhaust openings may be disposed exclusively in either the exhaust plate or top plate. It is also contemplated that the sizes, shapes, arrangement and number of exhaust openings 40 may vary without departing from the scope of this invention. For example, instead of being circular, the shape of the exhaust openings 40 may be slot-shaped, diamond-shaped or any other shape as long as the opening exhausts gas.

As described above, the orifices 42 in the recesses 35 of the modified susceptor 20 allow out-diffused dopants from the backside 36b of the wafer W to enter the central passage 26 (FIG. 6). However, the orifices 42 may also allow gas, especially purge gas, from the central passage 26 to enter the recesses 35. (As explained above, purge gas, which is typically either hydrogen or nitrogen gas, is typically continuously being introduced into the central passage 26 of the susceptor 20.) When the wafers W are in the recesses 35, expanding gas entering the orifices 42 from the central passage 26 creates pressure on the backside 36b of the wafer that may result in the wafer being displaced from the recess. This pressure is especially evident during loading and unloading of wafers W when the susceptor 20 is outside the reactor 60. During the deposition process, the temperature inside the central passage 26 of the susceptor 20 and outside the susceptor, i.e. in the reaction chamber 60, are about the same. Thus, gas pressures inside and outside the susceptor 60 are about the same. (Under the ideal gas law, gas pressure is a function of gas temperature). However, when the susceptor 20 is removed from the reaction chamber 62 after the epitaxial deposition, the temperature inside the susceptor is still extremely hot (i.e., about 300° C.) but the temperature outside the susceptor is at room temperature (about 20° C.). Because of the difference in temperature, the pressure inside the susceptor 20 caused by the expanding hot gas is much greater than the pressure outside the susceptor (which is atmospheric pressure), and a pressure gradient is created. The pressure gradient creates a net force that is directed from inside the susceptor 20 to outside of the susceptor. The hot gas inside the susceptor 20 could rush through the orifices 42 creating a net force on the backside 26b of the wafers W. Thus, when the susceptor 20 is drawn out of the reactor 60 after the epitaxial deposition process, the force created by the pressure gradient may be great enough to push the wafers W out of the recesses 35. Also, for reasons relating to efficiency of the deposition process which is well known in the art, the wafers W are typically loaded in the susceptor 20 when the temperatures of the susceptor and the gas inside the susceptor are greater than room temperature. Therefore, the pressure gradient is also present during loading of the susceptor 20, and it may be difficult to retain the wafers W in the recesses during loading because of the pressure gradient.

Figure 12:
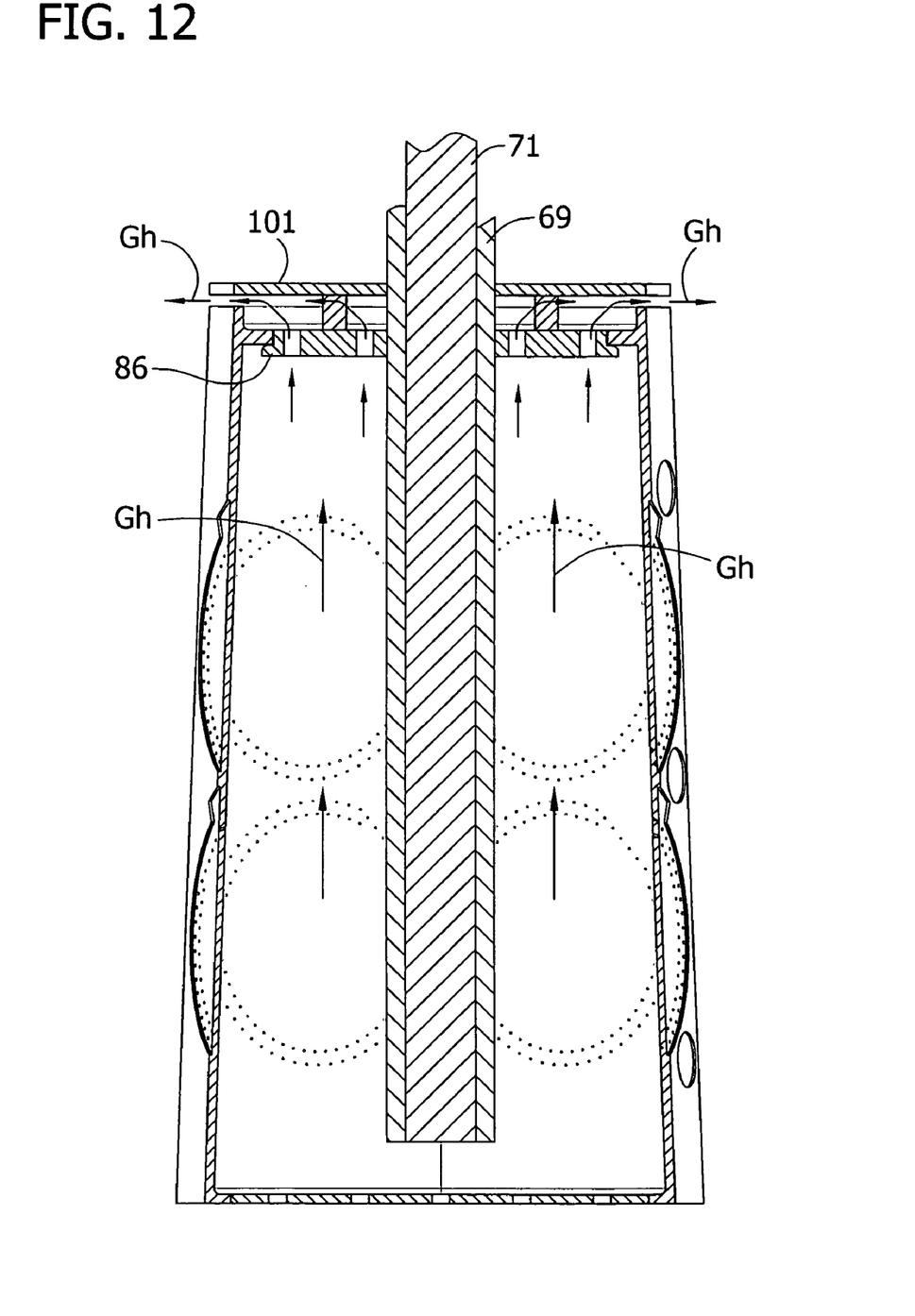
FIG. 12 is a vertical section of the susceptor of FIG. 9 showing the flow of hot gas from inside the susceptor to the outside of the susceptor through exhaust openings in the top of the susceptor.

The exhaust openings 40 in the top 22 of the susceptor 20 significantly relieve the pressure on the wafers W caused by the pressure gradient when the temperature of the gas inside the susceptor is greater than the temperature outside the susceptor (e.g., when susceptor is outside the reaction chamber). Referring to FIG. 12, instead of the expanding hot gas flowing through the orifices 42 in the recesses 35, most of the gas pressure is relieved through the larger exhaust openings 40 in the top 22 of the susceptor 20. The flow of hot gas is indicated by reference character $G_h$. Because the exhaust openings 40 are in the top 22 of the susceptor 20, rising hot gas inside susceptor has a direct route of escape. This phenomenon is related to the workings of a chimney. Smoke from the fire go directly up the chimney and exhaust out a flue. The smoke typically does not travel laterally from the fireplace and enter a room. The same concept applies in this invention. Instead of the hot gas flowing laterally outward through the orifices 42, the gas flows vertically and exits out the exhaust openings 80. Moreover, preferably the sum of the cross-sectional areas of the exhaust openings 40 is greater than the sum of the cross-sectional areas of the orifices 42, thereby directing more gas to escape through the exhaust openings rather than through the orifices. The pressure exerted on the wafers W is thereby limited or substantially eliminated such that the wafers remain in the recesses 35 even if there is a pressure gradient present (e.g., after susceptor 20 is removed from the reaction chamber 62). Other means for relieving pressure build-up in the susceptor 20, especially during loading and unloading of the wafers W may be employed within the scope of this invention.

Although the exhaust openings 40 in the top 22 of the susceptor 20 relieve pressure exerted on the backside 36b of the wafers W, the exhaust openings could provide a path for reactant gas to enter the central passage 26 of the susceptor. Referring now to FIGS. 9-12, a baffle plate, indicated at 101, is mounted on the top 22 of the susceptor 20 and overlies the exhaust openings 40. The illustrated baffle plate 101 is a thin, generally nonporous and gas impermeable plate having a hanger opening 103 in its center for receiving the hanger 67 therethrough. The baffle plate 101 is preferably slidable on the hanger 67. Preferably, the baffle plate 101 is made from a silicon carbide coated graphite material. The illustrated baffle plate 101 is coextensive with the top 22 of the susceptor 20, and has a pentagonal shape corresponding to the cross-sectional shape of the susceptor. Other configurations of the baffle plate 101 are within the scope of this invention.

In the illustrated embodiment, the baffle plate 101 is supported on the top 22 of the susceptor 20 by three spacers 105 disposed between the top of the susceptor and the baffle plate. The baffle plate 101 rests on top of the spacers 105. As shown best in FIG. 11, when the baffle plate 101 is mounted on the top 22 of the susceptor 20 using the spacers 105, a vertical space 107 having a height H is formed between the ledge portion 81 (i.e., along the periphery) of the top of the susceptor and the baffle plate. As described above, it is undesirable to have reactant gas entering the central passage 26 because silicon may coat the quartz sheath 67 and obstruct the pyrometers 73 used to control the temperature of the process. The baffle plate 101 of the present embodiment allows gas from the central passage 26 to exit through the exhaust openings 40 and outside the susceptor 20 while substantially precluding reactant gas from entering the central passage via the exhaust openings. The height H of the vertical space 107 between the baffle plate 101 and the top 22 of the susceptor 20 is preferably small enough that reactant gas is substantially precluded from entering the central passage 26 of the susceptor via the exhaust openings 40. The height H of the vertical space 107 between the baffle plate 101 and top 22 of the susceptor 20 is preferably large enough to adequately allow the hot gas inside the central passage 26 to pass out of the susceptor at a rate that, at the minimum, decreases the pressure exerted on the backside 36b of the wafers W to a point where the wafers will remain in the recesses 35 when a pressure gradient is formed. Preferably, the height H of the vertical space 107 is uniform and is between about 0.0625 inches (1.59 mm) and 0.25 inches (6.35 mm).

The spacers 105 determine the height H of the vertical space 107. Each spacer 105 is a column that contacts the top 22 of the susceptor 20 and a bottom 109 of the baffle plate 101. As illustrated, the spacers 105 are separate from the susceptor 20 and the baffle plate 101, although it is contemplated that the spacers may be integrally formed with either the bottom 109 of the baffle plate or the top 22 of the susceptor. Each spacer 105 has a cylindrical shape with a preferable height between about 0.56 inches (14.22 mm) and 0.75 inches (19.05 mm), and a preferable cross-sectional diameter of about 0.5 inches (12.70 mm). The desired heights of the spacers 105 will depend on the location of the spacers relative to the top 22 of the susceptor 20, for reasons discussed below. It is understood that the shapes, heights, sizes, arrangement and number of spacers 105 may vary without departing from the scope of this invention. For example, it is also contemplated that the spacers 105 may be disposed along the periphery of the baffle plate 101, or the ledge 81 of the top 22 of the susceptor 20. Obviously, if the spacers 105 are disposed on the recessed portion 82 of the top 22 of the susceptor 20, including the top plate 86 and/or the exhaust plate 95, then the heights of the spacers would need to be greater than the heights of the spacers if the spacers were disposed on the ledge 81 of the top of the susceptor in order to create the same desired height H of the vertical space 107 between the ledge of the top of the susceptor and the baffle plate 101.

Angled orifices 42 of the present invention, as describe above and shown best in FIG. 4, also are believed to help to reduce the pressure on the wafers W produced by hot gas inside the susceptor 20. Because each orifice 42 is angled such that the orifice intersects the rear surface 37 of the recess 35 at a location below where it intersects the central passage 26, it is less likely that hot gas that is rising inside the central passage will enter the orifice. That is, with orifices 42 angled upward relative from the recess 35, it is less likely that rising, expanding gas will flow into the orifice than if the orifices were horizontal or angled in an opposite downward the rear surface to the central passage 26.

Figure 13:
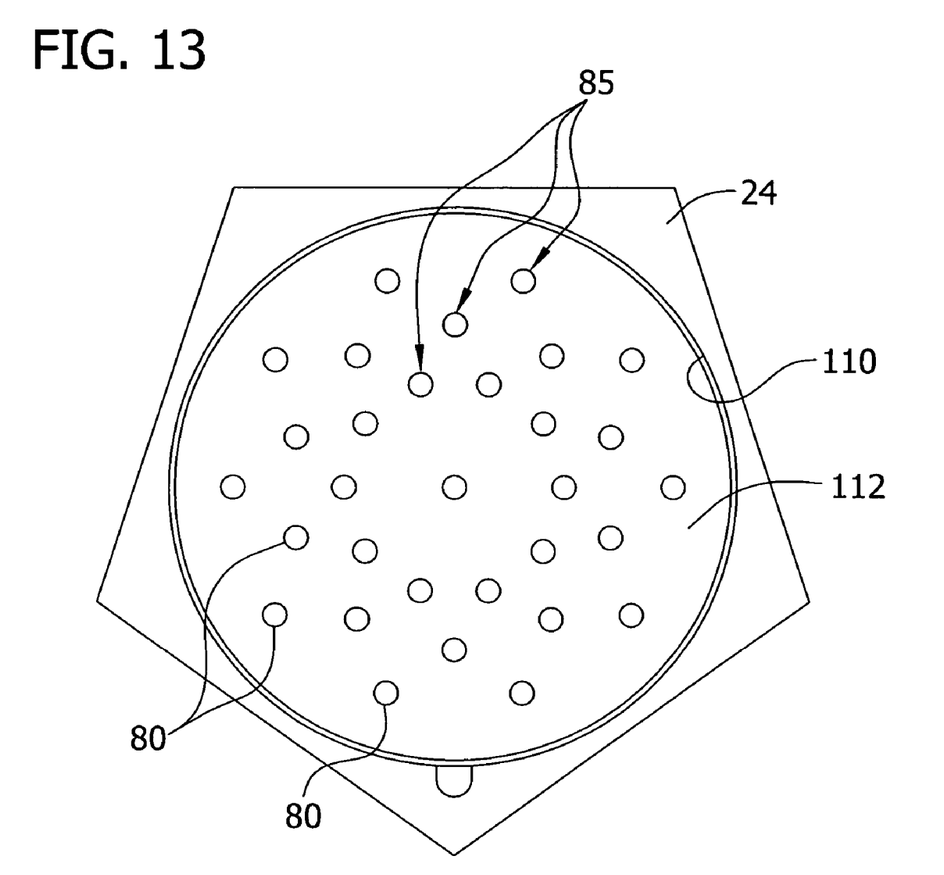
FIG. 13 is a bottom plan view of the modified susceptor.

Referring now to FIG. 13, a bottom plan view of the susceptor 20 of the present invention is shown. The bottom 24 of the susceptor 20 has a primary opening 110 sized and shaped for receiving a bottom plate 112. The bottom plate 112 can be attached in the primary opening 110, thus forming the bottom 24 of the susceptor 20. It is understood that the bottom 24 of the susceptor 20 may be formed by one or more components that are either integrally formed with the bottom of the susceptor or separately attached in the primary opening 110 of the bottom of the susceptor.

The bottom plate 112 has a plurality of the exhaust openings 80 having generally circular shapes. The exhaust openings 80 are adapted to exhaust purge gas, especially nitrogen and hydrogen gas from the central passage 26 of the susceptor 20 (FIG. 6). The exhaust openings 80 are disposed in groups 85. Each group 85 is arranged generally along a respective circle, and each opening 80 in each group is equidistant from the center of the bottom plate 112. The bottom plate 112 has one to three groups 85 and each group has ten exhaust openings 80 having a uniform cross-sectional area between about 0.10 in$^2$ (64.52 mm$^2$) and 0.40 in$^2$ (258.06 mm$^2$). The groups 85 are radially spaced about the bottom plate 112. Like the exhaust openings 40 in the top 22 of the susceptor 20, the sum of the areas of the exhaust openings 80 in the bottom plate 112 is preferably greater than the sum of the areas of the orifices 42 of the susceptor 20. It is contemplated that the shapes, the sizes, the number of the exhaust openings 80 in the bottom plate 112 and groups 85 of openings, and the arrangement of the openings may be other than described herein without departing from the scope of this invention.

The bottom plate 112 provides many more than the conventional one exhaust opening 17 (FIG. 1) for venting purge gas. These additional exhaust openings 80 assist in relieving pressure in the central passage 26 that might be caused by the introduction of purge gas into the central passage. Otherwise, purge gas may displace the wafers W from their respective recesses 35. The purge gas may rush from the central passage 26, through the orifices 42 and create pressure on the backside 36b of the wafers W. The exhaust openings 40 in the top 22 of the susceptor 20, as describe above, are well suited for exhausting hot purge gas or other gas out of the central passage 26 when there is a pressure gradient (e.g., right after the susceptor is removed from the reactor). However, during the epitaxial deposition process, the gas is typically not rushing upward. Instead, because the purge gas is being introduced from the top of the central passage 26, the gas is being directed downward. Therefore, forming more openings 80 in the bottom plate 112 may relieve pressure from the introduction of pressurized purge gas and decrease the amount of pressure exerted on the backside 36b of the wafers W, especially during the epitaxial deposition process. Moreover, by preferably forming the exhaust openings 80 such that the sum of the cross-sectional areas of the exhaust openings is greater than the sum of the cross-sectional areas of the orifices 42, more gas is more likely to flow outside the susceptor through the exhaust openings rather than the orifices.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A susceptor for supporting wafers in a reaction chamber of a barrel reactor during a chemical vapor deposition process, the susceptor comprising:

a body having a top, a bottom, a generally elongate central passage within the body extending between the top and bottom of the body, and a face directed laterally generally away from the central passage, the top of the body connects to a purge gas inlet outside the reaction chamber;

plural recesses in the face of the body having a rear surface, each recess being sized and shaped to receive and support a wafer so that when the wafer is received within the recess a front surface of the wafer faces generally away from the rear surface for exposure to reactant gas inside the reaction chamber of the barrel reactor and a rear surface of the wafer is in a generally opposed relationship with the rear surface of the recess;

an orifice in the rear surface of each recess extending to the central passage of the body such that each recess is in fluid communication with the central passage;

a central opening in the top of the body for use in hanging the susceptor in the reaction chamber during the chemical vapor deposition process;

an exhaust opening in the top of the body separate from the central opening and in communication with the central passage, said exhaust opening being adapted to exhaust gas from the central passage to outside the susceptor when the susceptor is secured to a hanger to reduce the gas pressure being exerted on the rear surface of the wafer when the wafer is received in the circular recess caused by expanding gas in the central passage passing through the orifice and into the recess;

further comprising a baffle plate adapted to be mounted on the top of the body for generally overlying the exhaust opening to substantially preclude reactant gas from entering the central passage through the exhaust opening, wherein said baffle plate is coextensive with the top of the body such that there is a vertical space between said baffle plate and the top of the body.

2. A susceptor as set forth in claim 1 wherein the top of the body comprises a primary opening in the top of the body, the susceptor further comprising a top plate received in the primary opening and defining a secondary opening.

3. A susceptor as set forth in claim 2 further comprising an exhaust plate received in the secondary opening, the exhaust opening extending through at least one of the top plate and the exhaust plate.

4. A susceptor as set forth in claim 1 wherein the baffle plate is generally coextensive with the top of the body.

5. A susceptor as set forth in claim 1 further comprising at least one spacer disposed between the top of the body and the baffle plate to form a distance between the top of the body and the baffle plate.

6. A susceptor as set forth in claim 5 wherein the at least one spacer is integral with the baffle plate.

7. A susceptor as set forth in claim 5 further comprising a plurality of spacers having uniform heights and being spaced generally equidistantly apart generally along the perimeter of the top of the plate such that the vertical space between the top of the body and the baffle plate has a height that is generally uniform along the entirety of the perimeters of the top of the body and the baffle plate.

8. A susceptor as set forth in claim 7 wherein the distance between the top of the body and the baffle plate measures from about 0.0625 inches (about 1.59mm) to about 0.25 inches (about 6.35 mm).

9. A susceptor as set forth in claim 1 wherein the orifice is angled in a direction such that the orifice intersects the rear surface of the recess at a location below where it intersects the central passage.

\* \* \* \* \*